United States Patent
Wingsch et al.

(10) Patent No.: US 7,257,890 B2
(45) Date of Patent: Aug. 21, 2007

(54) EXPOSURE MASK DEVICE AND METHOD FOR ORIENTING A PLURALITY OF SUBSTRATES ON AN EXPOSURE MASK

(75) Inventors: Volker Wingsch, Reutlingen (DE); Joachim Gluck, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 250 days.

(21) Appl. No.: 10/489,528

(22) PCT Filed: Aug. 28, 2002

(86) PCT No.: PCT/DE02/03143

§ 371 (c)(1),
(2), (4) Date: Sep. 13, 2004

(87) PCT Pub. No.: WO03/025679

PCT Pub. Date: Mar. 27, 2003

(65) Prior Publication Data

US 2005/0014073 A1    Jan. 20, 2005

(30) Foreign Application Priority Data

Sep. 12, 2001 (DE) .................. 101 44 876

(51) Int. Cl.
*G03F 7/20* (2006.01)
*G03F 9/00* (2006.01)

(52) U.S. Cl. .................. 29/829; 29/720; 29/743; 29/759; 355/53; 430/5; 430/22

(58) Field of Classification Search ........... 29/750, 29/759, 760, 825, 829, 720, 721, 743; 355/53, 355/55, 72, 75; 430/5, 20, 30, 22
See application file for complete search history.

(56) References Cited

U.S. PATENT DOCUMENTS

| | | | | |
|---|---|---|---|---|
| 4,345,836 A | * | 8/1982 | Phillips | 355/53 |
| 4,953,283 A | * | 9/1990 | Kawabata et al. | 29/593 |
| 5,160,959 A | * | 11/1992 | Everett et al. | 355/53 |
| 5,540,535 A | * | 7/1996 | Hamuro et al. | 414/416.04 |
| 5,964,397 A | * | 10/1999 | Dautartas | 228/180.22 |
| 5,996,985 A | | 12/1999 | Balz et al. | 269/48.1 |

FOREIGN PATENT DOCUMENTS

| | | |
|---|---|---|
| DE | 199 34 114 | 1/2001 |
| EP | 36 47 47 | 4/1990 |
| EP | 364747 A1 * | 4/1990 |

* cited by examiner

*Primary Examiner*—Peter Vo
*Assistant Examiner*—Livius R. Cazan
(74) *Attorney, Agent, or Firm*—Kenyon & Kenyon LLP

(57) ABSTRACT

A method for registering a plurality of substrates that are retained on a workpiece carrier onto an exposure mask for carrying out a photolithography process has the steps of registering and immobilizing the exposure mask onto an alignment panel having precisely fitting passthrough orifices for reception of one substrate for each passthrough orifice and inserting into the passthrough orifices of the alignment panel the substrates that are retained on the workpiece carrier.

7 Claims, 3 Drawing Sheets

EXPOSURE MASK DEVICE AND METHOD FOR ORIENTING A PLURALITY OF SUBSTRATES ON AN EXPOSURE MASK

FIELD OF THE INVENTION

The present invention relates to a method for registering a plurality of substrates that are retained on a workpiece carrier onto an exposure mask for carrying out a photolithography process. The present invention further relates to an exposure mask device for performing a photolithography process for a plurality of substrates that are retained on a workpiece carrier having an exposure mask.

BACKGROUND INFORMATION

In contrast to semiconductor production of silicon wafers, which are processed individually, the manufacture of devices such as micromechanical sensors is accomplished using relatively small substrates. In this context, the base substrate is present in the form of a small cylindrical steel element. In order for the manufacturing process and for application of a circuit produced in thin-film technology onto such substrates to be cost-effective, the substrates are processed in multiple fashion. The individual base substrates are therefore retained in large numbers on a workpiece carrier, and processed together.

High-pressure sensors that are utilized in many automotive engineering systems and in automation technology are fabricated on such substrates. Applications include, for example, direct fuel injection, common-rail technology for diesel vehicles, electrohydraulic brake systems, vehicle dynamics control systems, and many more.

Pressure is sensed via the deflection of the sensor membrane, which is coated with a Wheatstone measurement bridge using thin-film technology. The circuit is patterned using a photolithographic manufacturing process. Contacting and passivation can also be performed using a production step of this kind. The quality of high-pressure sensors depends substantially on the accuracy with which the resistance features of the Wheatstone measurement bridge are positioned on the pressure membrane. The resistances must be centered as much as possible on the pressure membrane. This positional accuracy substantially influences the electrical properties of the measurement bridge, for example, the range of the signal furnished by the sensor.

It is believed that the photolithographic process of patterning the functional layer to form the resistances is therefore essential in the production of a high-pressure sensor. A preconditioning of the surface of the functional layer, application of a photosensitive resist onto the functional layer, an oven step to condition the resist for exposure, exposure of the resist through an exposure mask, development of the exposed features, an oven step to condition the developed resist structure for etching, mapping of the resist image into the functional layer using an etching process, and subsequent stripping of the photoresist mask from the completed etched functional structure, are usually performed in this context.

The location of the resistances may be determined in the exposure step. The substrates, previously diced and retained on a workpiece carrier, may then be exposed with sufficient positional accuracy relative to an exposure mask. In contrast to the exposure of silicon wafers in semiconductor production, in which the wafers can be registered as one piece with the exposure mask (e.g. a quartz mask) to be imaged, in the exposure of the previously diced plurality of substrates there may be a positional inaccuracy for each substrate with respect to the imaging exposure mask.

It is believed that the substrates are often handled in immovably bolted-down workpiece carriers that must each be individually registered with respect to the exposure mask. This registration operation is performed manually.

For example, in the projection exposure method of the Nagano Keiki Co. Ltd., a special workpiece carrier that is automatically positionable is provided in each case. This workpiece carrier is not identical for the subsequent processes.

SUMMARY OF THE INVENTION

It is believed that the exemplary method of the present invention provides a method for registering a plurality of substrates that are retained on a workpiece carrier so as to make possible large-scale production of the structures with sufficient positional accuracy on the substrates, with no need to gang-switch over into an extra workpiece carrier.

This is achieved by:
registering and immobilizing an exposure mask with respect to an alignment panel, the alignment panel having precisely fitting passthrough orifices for reception of one substrate for each passthrough orifice; and
inserting into the passthrough orifices of the alignment panel the substrates that are retained on the workpiece carrier.

As a result of the use of an alignment panel having precisely fitting passthrough orifices into which the substrates are respectively inserted, only a single registration and immobilization of the exposure mask with respect to the alignment panel is performed. The workpiece carriers with the retained substrates can then, in the continuous production process, be moved in the direction of the alignment panel so that the substrates are inserted into the passthrough orifices and thereby automatically aligned.

Manual operations to gang-switch the substrates from one workpiece carrier system into another are thus not needed. The workpiece carriers, populated with substrates, can now be processed entirely automatically and it is not necessary to register each populated workpiece carrier with respect to the exposure mask. Instead, the exposure mask is registered once with the alignment panel. In addition, only a single alignment panel is required for each exposure mask, and an alignment panel of this kind does not need to be placed onto each workpiece carrier that is to be exposed.

Insertion of the substrates may be accomplished with helical motions, thus simplifying the threading-in of the substrates upon insertion into the passthrough orifices. Registration of the exposure mask onto the alignment panel may be accomplished using alignment marks that are provided on the exposure mask and in the alignment panel. The alignment marks may be positioned at mutually coordinated distances on the exposure mask and the alignment panel. They can be introduced upon manufacture of the exposure mask and alignment panel. It is also possible to introduce small inserted parts into the alignment panel as alignment marks. Registration may then be accomplished by automatic optical detection of the alignment marks.

This may also be achieved, by way of an alignment panel having precisely fitting passthrough orifices for reception of one substrate for each passthrough orifice, and an arrangement for registering and immobilizing the exposure mask and alignment panel with respect to one another.

It is believed to be particularly advantageous if the alignment panel has a vacuum conduit for pulling and immobilizing the alignment panel by suction onto the exposure mask device. The vacuum conduit may then extend in the rim region along the outer edge of the alignment panel. By the extraction of air, e.g., through a orifice in the exposure mask device, a vacuum is then generated in the vacuum conduit and the exposure mask device and alignment panel are joined to one another.

DETAILED DESCRIPTION

Figure 1:
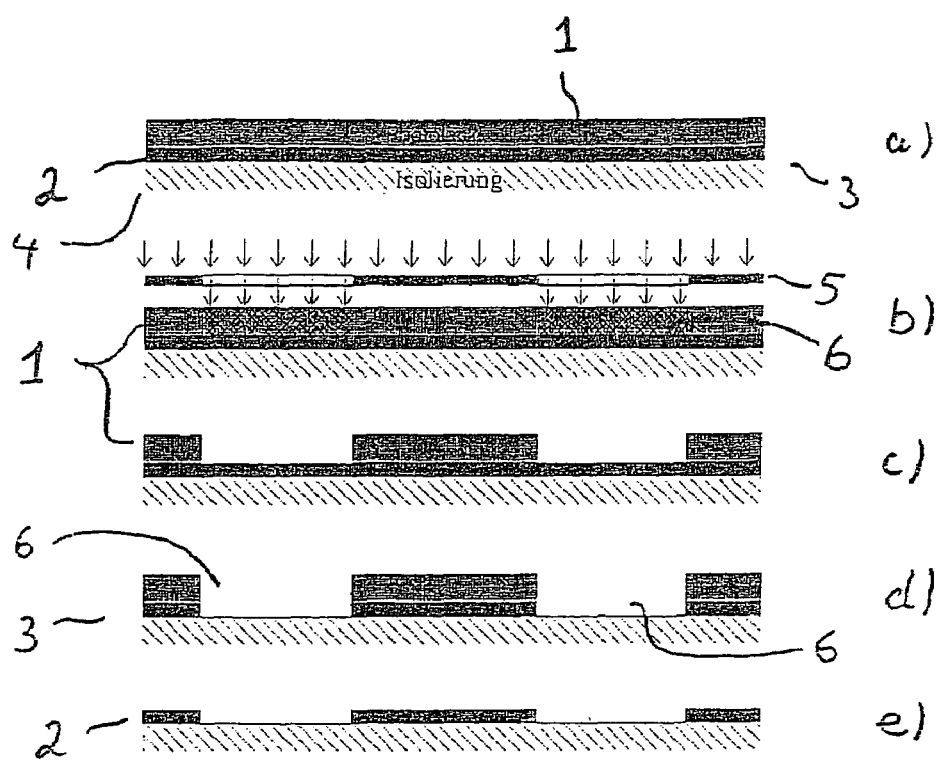
FIG. 1 shows a photolithographic process for producing thin-film structures according to an exemplary embodiment of the present invention.

FIG. 1 shows an embodiment of a photolithographic process for manufacturing thin-film structures according to the present invention.

In a first step a), a photoresist layer 1 is applied onto functional layer 2 of the substrate that is to be patterned. Functional layer 2 is located on an insulating layer 4.

In a second step b), an exposure mask 5 is registered onto substrate 3, and photoresist layer 1 is irradiated with ultraviolet light. Exposed regions 6 of photoresist layer 1 form the desired pattern.

In a third step c), the exposed photoresist layer 1 is developed so that photoresist layer 1 is removed in exposed regions 6.

In a fourth step d), the surface of substrate 3 is etched so that functional layer 2 is removed in exposed regions 6.

In a fifth step e), photoresist layer 1 is washed off so that a patterned functional layer 2 now remains.

Figure 2:
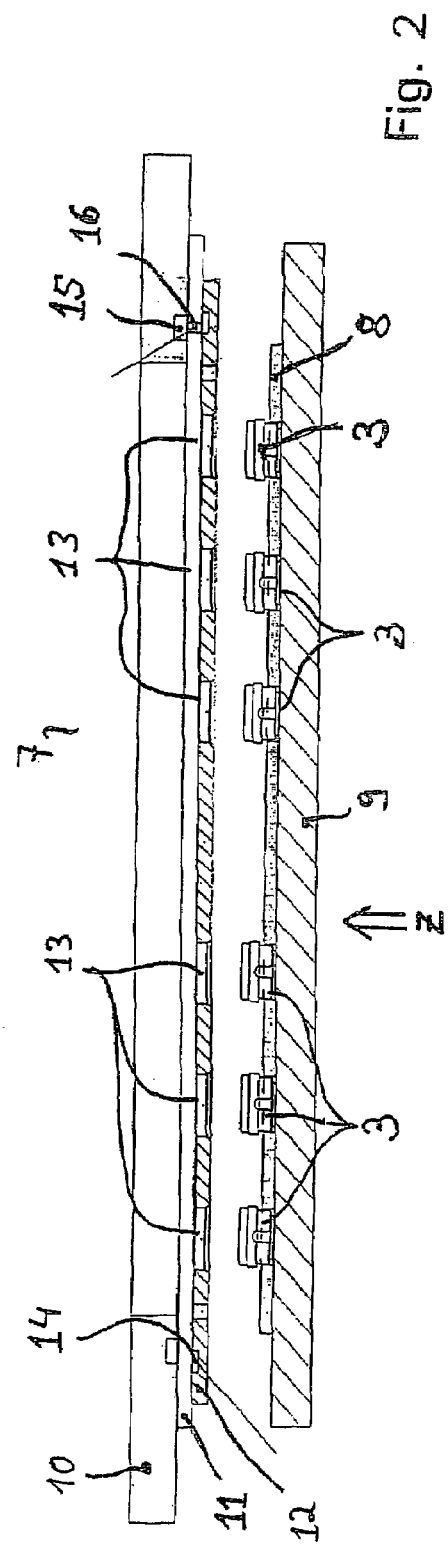
FIG. 2 is a cross-sectional view of an exposure mask device having an alignment panel and an oppositely located workpiece carrier having retained substrates.

FIG. 2 shows, in cross section, an exposure mask device 7 for a photolithographic process of this kind. A plurality of substrates 3 are retained on a workpiece carrier 8. Workpiece carrier 8 is mounted on a processing chuck 9 of exposure mask device 7 that is displaceable in the Z direction (arrow).

Positioned opposite processing chuck 9 with workpiece carrier 8 is a holding frame 10 for holding exposure mask 11, in particular a quartz mask. According to the present invention, an alignment panel 12 that is registered relative to exposure mask 11 may be secured on exposure mask 11. Alignment panel 12 has a plurality of passthrough orifices 13, each for reception of one substrate 3. Passthrough orifices 13 fit precisely so that substrates 3 are optimally registered with exposure mask 11 when the latter is inserted into passthrough orifices 13 and alignment panel 12 is optimally registered with exposure mask 11.

A vacuum conduit 14 is provided in the rim region along the outer edge of alignment panel 12 in order to pull the alignment panel 12 into the exposure mask 11 by suction and to immobilize it. A corresponding peripheral vacuum conduit 15 is included in holding frame 10. A orifice 16 in exposure mask 11 ensures the passage of vacuum from vacuum conduit 15 of holding frame 10 into vacuum conduit 14 of alignment panel 12.

Figure 3:
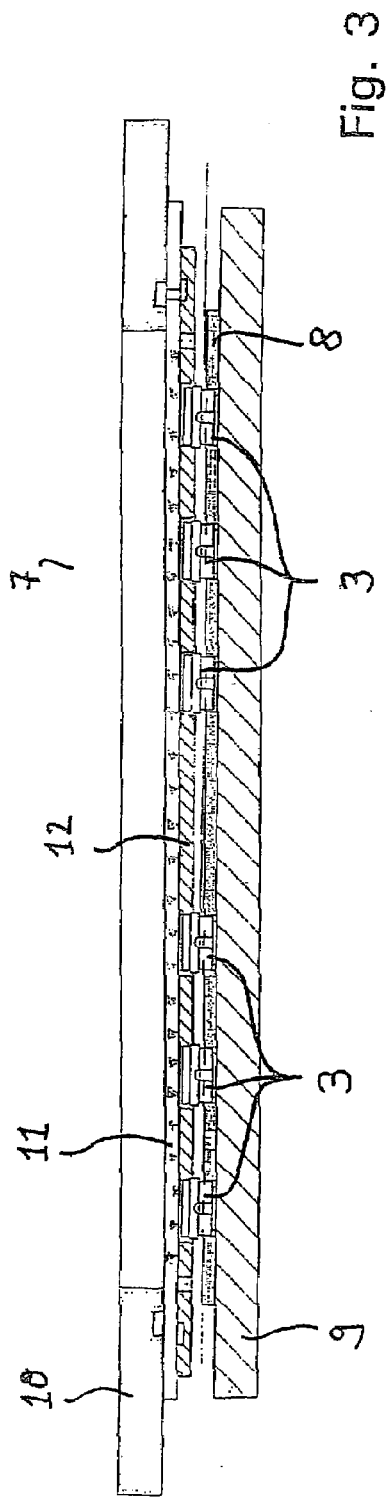
FIG. 3 shows the exposure mask device of FIG. 2 shown with substrates that are inserted into the passthrough orifices of the alignment panel.

FIG. 3 illustrates exposure mask 7 of FIG. 2, in which the processing chuck 9 is moved in the Z direction toward holding frame 10. Substrates 3 are optimally aligned and fit precisely into passthrough orifices 13 of alignment panel 12, and are thereby registered onto exposure mask 11. In this position, exposure can now be performed, e.g., by UV radiation.

Figure 4:
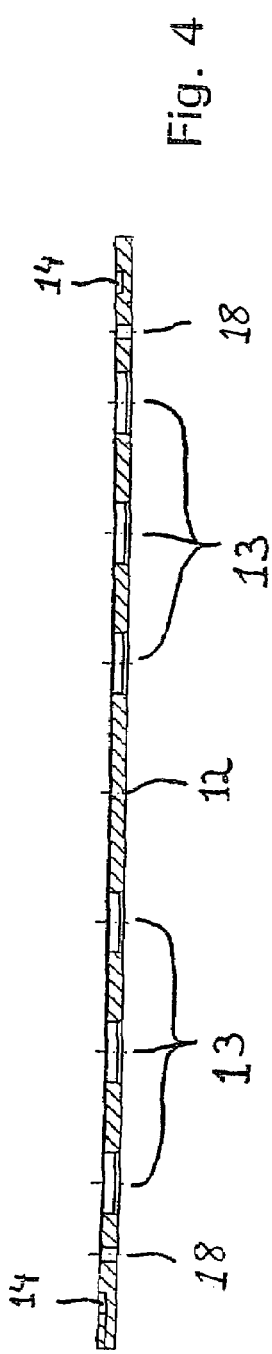
FIG. 4 is a cross-sectional view of an alignment panel for the exposure mask device shown in FIG. 2 and FIG. 3 according to an embodiment of the present invention.

FIG. 4 illustrates alignment panel 12 in cross section. As shown, passthrough orifices 3 have a bevel on the side of alignment panel 12, facing toward workpiece carrier 8, from which substrates 3 are introduced. The free play of substrates 3 in the Z axis upon introduction is thereby reduced. Registration of substrates 3 upon introduction into the precisely fitting passthrough orifices 13 may be accomplished with helical motions of workpiece carrier 8, so that substrates 3 are guided into the optimum position.

Additionally, alignment panel 12 has alignment marks 18 that can be implemented in the form of orifices, with which alignment panel 12 can be optically registered onto exposure mask 11. Alignment marks (not depicted) are likewise provided in the corresponding positions on exposure mask 11.

Figure 5:
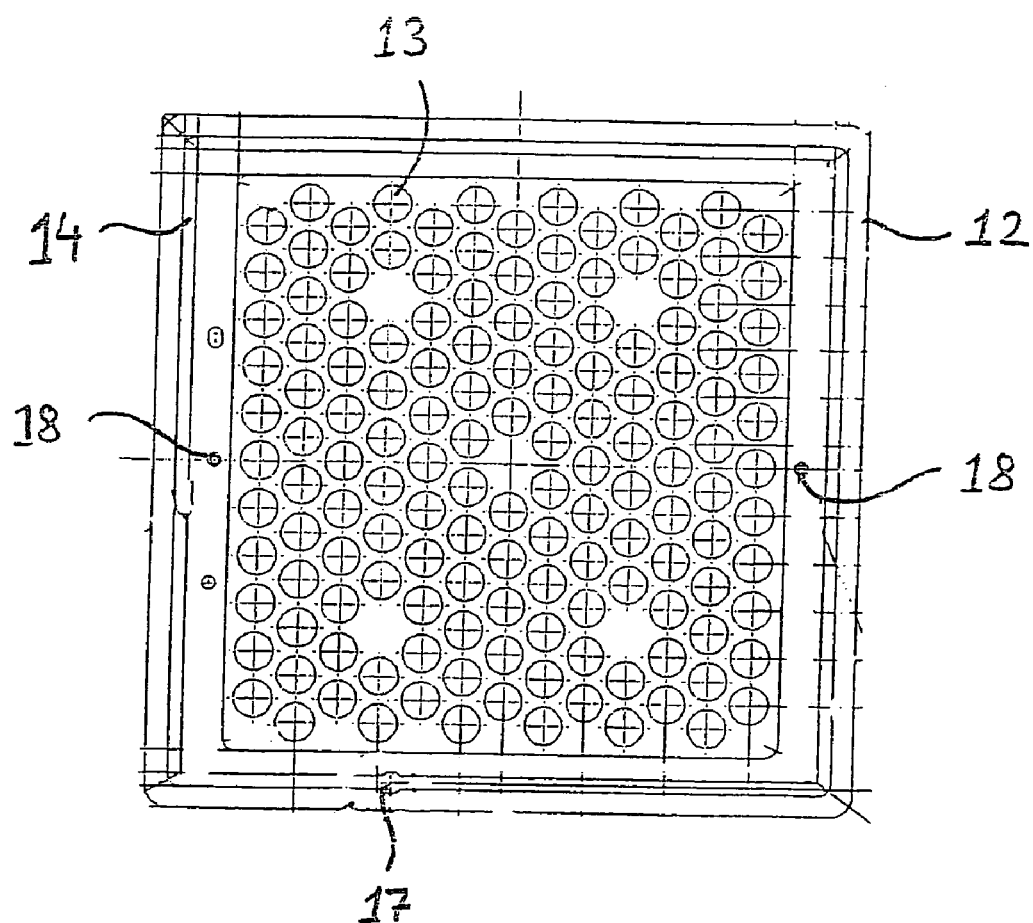
FIG. 5 is a plan view of the alignment panel shown in FIG. 4.

FIG. 5 depicts alignment panel 12 in a plan view. As shown, a plurality of passthrough orifices 13 are introduced into alignment panel 12. These are disposed in accordance with the associated exposure mask 11.

A peripheral vacuum conduit 14 extends in the rim region along the outer edge of alignment panel 12 in order to immobilize alignment panel 12 against an exposure mask 11 by suction. Provided in vacuum conduit 14 is an enlargement 17 that ends up located exactly beneath orifice 16 of exposure mask 11, in order to ensure feedthrough of vacuum to holding frame 10.

Two alignment marks 18 are also provided on alignment panel 12 in order to register alignment panel 12 optically onto exposure mask 11.

Figure 6:
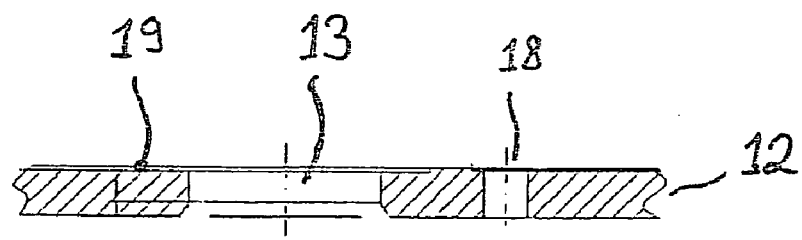
FIG. 6 is a cross-sectional view of a portion of the alignment panel shown in FIG. 4.

FIG. 6 illustrates a portion of alignment panel 12 in cross section. Passthrough orifices 13 each have a bevel, so that substrates 3 can be threaded into the precisely fitting passthrough orifice 13 without mechanical damage. Alignment mark 18, implemented as an orifice, is also shown.

Alignment panel 12 furthermore has a shoulder 19 between the rim region and the region of passthrough orifices 13. This shoulder 19 ensures that a defined spacing, useful for protecting the structures of exposure mask 11, exists between the patterned region of exposure mask 11 and alignment panel 12 with substrates 3.

What is claimed is:

1. A method for registering a plurality of substrates that are retained on a workpiece carrier onto an exposure mask for performing a photolithography process, comprising:

registering and immobilizing the exposure mask onto an alignment panel, the alignment panel having precisely fitting passthrough orifices for reception of one substrate for each passthrough orifice; and inserting into the passthrough orifices of the alignment panel the substrates that are retained on the workpiece carrier, wherein the exposure mask is registered onto the alignment panel using alignment marks that are provided on the exposure mask and the alignment panel, and by pulling and immobilizing the alignment panel by suction into the exposure mask via a vacuum conduit extending in a rim region along an outer edge of the alignment panel, and via an orifice in the exposure mask which allows a vacuum connection between the vacuum conduit of the alignment panel and a vacuum conduit of a holding frame for the exposure mask.

2. The method of claim 1, wherein the substrates are inserted using helical motions of the workpiece carrier.

3. The method of claim 1, further comprising:
automatically optically detecting the alignment marks.

4. An exposure mask device for performing a photolithography process for a plurality of substrates that are retained on a workpiece carrier, comprising:
an exposure mask;
an alignment panel having precisely fitting passthrough orifices for reception of one substrate for each passthrough orifice; and
an arrangement for registering and immobilizing the exposure mask and alignment panel with respect to one another,
wherein:
the exposure mask and the alignment panel include alignment marks for orientation of the exposure mask with respect to the alignment panel;
the alignment panel includes a vacuum conduit for pulling and immobilizing the alignment panel by suction into the exposure mask device, the vacuum conduit extending in a rim region alone an outer edge of the alignment panel; and
the exposure mask includes an orifice to allow a vacuum connection between the vacuum conduit of the alignment panel and a vacuum conduit of a holding frame for the exposure mask.

5. The exposure mask device of claim 4, wherein the workpiece carrier is displaceable in a direction of the exposure mask device to insert the substrates retained on the workpiece carrier into the passthrough orifices of the alignment panel.

6. The exposure mask device of claim 5, wherein the exposure mask device and the workpiece carrier are such that the substrates are inserted using helical motions of the workpiece carrier.

7. The exposure mask device of claim 4, wherein the passthrough orifices in the alignment panel each have a bevel for introduction of the substrates.

* * * * *